US010076056B2

United States Patent
(12) United States Patent
Zhang et al.

(10) Patent No.: US 10,076,056 B2
(45) Date of Patent: Sep. 11, 2018

(54) COOLING FAN AND ELECTRONIC DEVICE HAVING THE SAME

(71) Applicant: CHAMP TECH OPTICAL (FOSHAN) CORPORATION, Foshan (CN)

(72) Inventors: Yong-Kang Zhang, Foshan (CN); Yung-Ping Lin, New Taipei (TW)

(73) Assignee: CHAMP TECH OPTICAL (FOSHAN) CORPORATION, Foshan (CN)

( * ) Notice: Subject to any disclaimer, the term of this patent is extended or adjusted under 35 U.S.C. 154(b) by 10 days.

(21) Appl. No.: 15/592,302

(22) Filed: May 11, 2017

(65) Prior Publication Data

US 2018/0132381 A1 May 10, 2018

(30) Foreign Application Priority Data

Nov. 4, 2016 (CN) .......................... 2016 1 0964175

(51) Int. Cl.

| | |
|---|---|
| ***H05K 7/20*** | (2006.01) |
| ***H02K 1/18*** | (2006.01) |
| ***H02K 7/09*** | (2006.01) |
| ***H02K 7/14*** | (2006.01) |
| *F04D 25/06* | (2006.01) |
| *H02K 3/34* | (2006.01) |

(52) U.S. Cl.

CPC ......... *H05K 7/20172* (2013.01); *H02K 1/187* (2013.01); *H02K 7/09* (2013.01); *H02K 7/14* (2013.01); *H05K 7/20* (2013.01); *H05K 7/20009* (2013.01); *H05K 7/20136* (2013.01); *H05K 7/20145* (2013.01); *H05K 7/20163* (2013.01); *F04D 25/0633* (2013.01); *F04D 25/0646* (2013.01); *H02K 3/345* (2013.01)

(58) Field of Classification Search

None

See application file for complete search history.

(56) References Cited

U.S. PATENT DOCUMENTS

2012/0315168 A1* 12/2012 Yan .......................... H02K 7/09 417/423.7

FOREIGN PATENT DOCUMENTS

| | | |
|---|---|---|
| CN | 102465903 A | 5/2012 |
| CN | 103225628 A | 7/2013 |
| JP | 2006-70808 A | 3/2006 |

* cited by examiner

*Primary Examiner* — Dimary Lopez Cruz
*Assistant Examiner* — Zhengfu Feng
(74) *Attorney, Agent, or Firm* — ScienBiziP, P.C.

(57) ABSTRACT

A cooling fan with shapes, sizes, and placements of frame and supporting ribs tuned to reduce operational vibration and noise includes a fan frame, a supporting base, and a plurality of ribs. The fan frame includes a bottom plate and a sidewall connected to the bottom plate. The supporting base is formed at the bottom plate. The plurality of ribs extends from an outer circumferential surface of the supporting base to the sidewall. At least one of the plurality of ribs and the fan frame is asymmetrical with respect to the supporting base.

14 Claims, 4 Drawing Sheets

COOLING FAN AND ELECTRONIC DEVICE HAVING THE SAME

The subject matter relates to a cooling fan and an electronic device having the cooling fan.

BACKGROUND

Heat generating components, such as central processing units (CPUs), generate heat when in operation. In an electronic device that uses the CPU, a cooling fan can be used to dissipate heat.

The cooling fan usually includes an impeller. The impeller includes a hub and a number of blades extending from an outer surface of the hub. When in use, the blades rotate to generate airflow. Increasing the rotating speed of the blades increases the airflow to improve heat dissipation, but also increases the vibration and noise generated by the cooling fan.

Therefore, there is room for improvement within the art.

BRIEF DESCRIPTION OF THE DRAWINGS

Implementations of the present technology will now be described, by way of example only, with reference to the attached figures.

DETAILED DESCRIPTION

Figure 1:
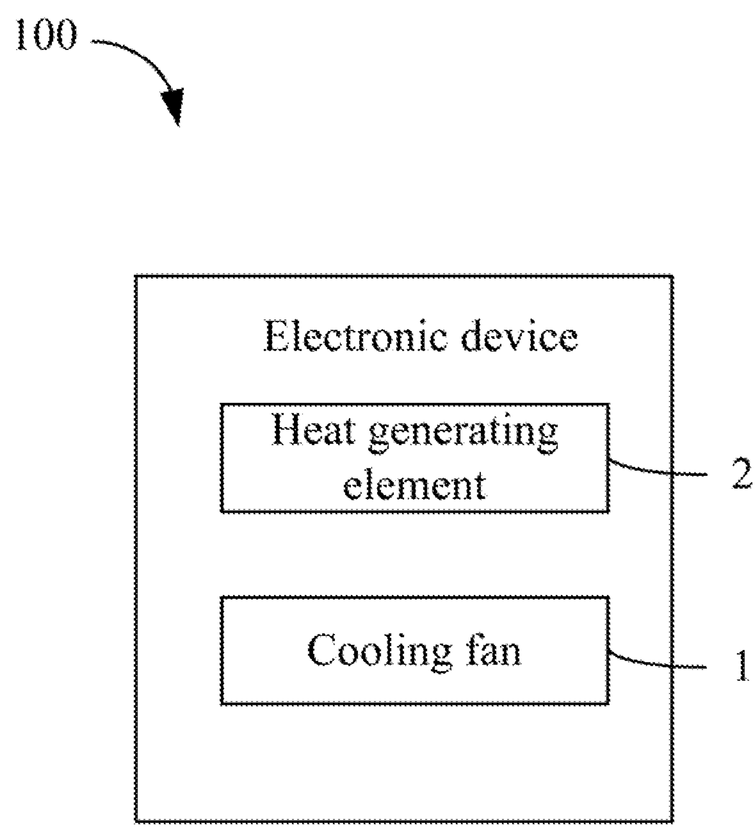
FIG. 1 is a diagram of an exemplary embodiment of an electronic device with built-in heat dissipation capability.

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein can be practiced without these specific details. In other instances, methods, procedures, and components have not been described in detail so as not to obscure the related relevant feature being described. Also, the description is not to be considered as limiting the scope of the exemplary embodiments described herein. The drawings are not necessarily to scale and the proportions of certain parts may be exaggerated to better illustrate details and features of the present disclosure.

The term "coupled" is defined as connected, whether directly or indirectly through intervening components, and is not necessarily limited to physical connections. The connection can be such that the objects are permanently connected or releasably connected. The term "outside" refers to a region that is beyond the outermost confines of a physical object. The term "inside" indicates that at least a portion of a region is partially contained within a boundary formed by the object. The term "substantially" is defined to be essentially conforming to the particular dimension, shape, or other word that the term modifies, such that the component need not be exact. For example, "substantially cylindrical" means that the object resembles a cylinder, but can have one or more deviations from a true cylinder. The term "comprising," when utilized, means "including, but not necessarily limited to"; it specifically indicates open-ended inclusion or membership in the so-described combination, group, series, and the like.

FIG. 1 illustrates an exemplary embodiment of an electronic device 100. The electronic device 100 comprises at least one heat generating element 2 and a cooling fan 1 for dissipating the heat generated by the heat generating element 2. In at least one exemplary embodiment, the electronic device 100 can be a computer. The heat generating element 2 can be a CPU.

Figure 2:
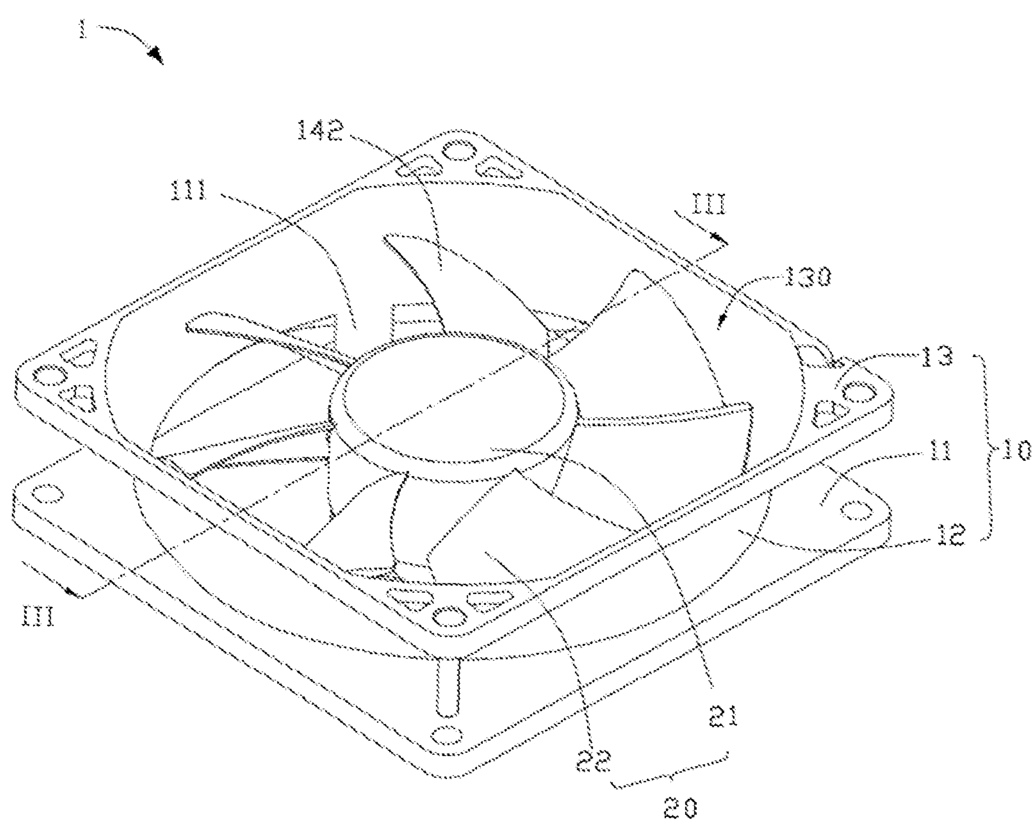
FIG. 2 is a schematic view of a cooling fan in the electronic device of FIG. 1.
Figure 3:
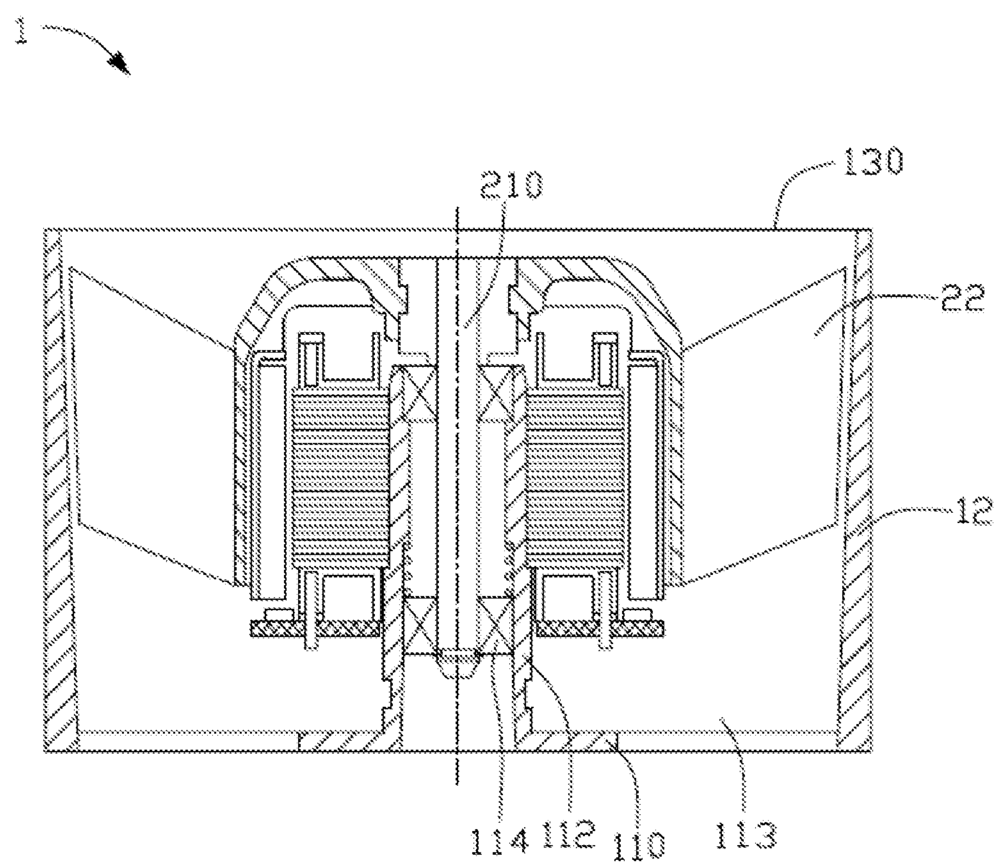
FIG. 3 is a cross-sectional view taken along line of FIG. 2.
Figure 4:
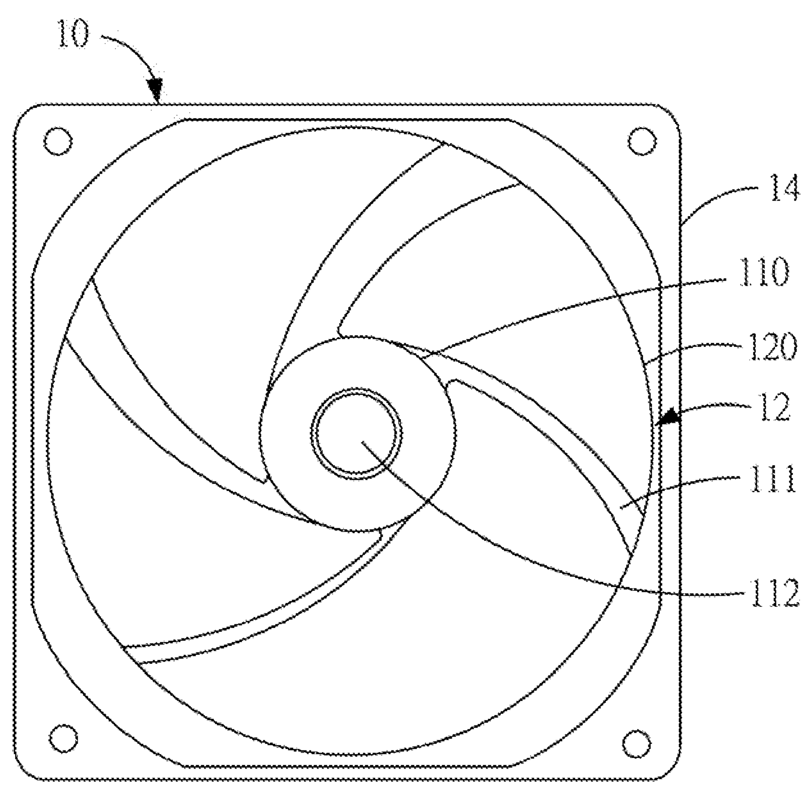
FIG. 4 is schematic view showing the cooling fan of FIG. 2 without an impeller.

FIGS. 2-4 illustrate that the cooling fan 1 comprises a fan frame 10 and an impeller 20 received in the fan frame 10.

The fan frame 10 comprises a bottom plate 11, an upper cover 13 facing the bottom plate 11, and a sidewall 12 connected between the bottom plate 11 and the upper cover 13. The upper cover 13 matches the bottom plate 11 in shape. The bottom plate 11 and the upper cover 13 can be rectangular, square, circular or any other shape. The upper cover 13 defines a substantially circular air inlet 130. The bottom plate 11 defines a substantially circular air outlet 113.

In at least one exemplary embodiment, a diameter of the air inlet 130 is greater than a diameter of the air outlet 113. The sidewall 12 extends from an inner rim of the air inlet 130 to the inner rim of the air outlet 113, so that the sidewall 12 forms an inclined surface from the air inlet 130 to the air outlet 113.

Please refer to FIG. 4, a substantially circular supporting base 110 is formed at the air outlet 113. A plurality of ribs 111 extends from an outer circumferential surface of the supporting base 110 to the sidewall 12, thereby supporting the supporting base 110 in the fan frame 10. In at least one exemplary embodiment, the number of the ribs 111 is four. In other exemplary embodiments, the number of the ribs 111 can vary as needed. At least one of the plurality of ribs 111 and the fan frame 10 are asymmetrical with respect to the supporting base 110.

Referring to FIGS. 2-4, a substantially cylindrical central tube 112 extends from a center of the supporting base 110 towards the upper cover 13. The impeller 20 comprises a hub 21 and a number of blades 22 extending from an outer circumferential surface of the hub 21. In at least one exemplary embodiment, the blades 22 extend from the hub 21 towards the sidewall 12. A bearing 114 is received in the central tube 112. The hub 21 comprises a shaft 210. The hub 21 is mounted to the bearing 114 through the shaft 210, so that the impeller 20 can rotate with respect to the central tube 112.

When in use, the impeller 20 can rotate with respect to the central tube 112 to generate airflows. The airflow enters the fan frame 10 through the air inlet 130, and exit the fan frame 10 through the air outlets 113.

In at least one exemplary embodiment, sizes of the ribs 111 are different from each other, so that the ribs 111 are asymmetrical with respect to the supporting base 110. In another exemplary embodiment, centers of gravity of the ribs 111 are asymmetrical with respect to the supporting base 110. That is, the positions of the ribs 111 in the fan frame 10 are asymmetrical with respect to the supporting base 110.

In other exemplary embodiments, the fan frame 10 is asymmetrical with respect to the supporting base 110. For example, the bottom plate 11 and the upper cover 13 are square. That is, both the bottom plate 11 and the upper cover 13 each have four edges 14. The sidewall 12 comprises four sidewall portions 120 corresponding to the four edges 14 and the four sidewall portions 120 are connected end-to-end. Thicknesses of the four sidewall portions 120 are different from each other.

With the above configuration, the ribs 111 and/or the fan frame 10 are asymmetrical with respect to the supporting base 110. As such, when the impeller 20 rotates, vibration which is generated at different locations of the cooling fan 1 has different frequencies of vibration, this reduces resonance and decreases noise in operation.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments, to the full extent indicated by the plain meaning of the terms in which the appended claims are expressed.

What is claimed is:

1. A cooling fan comprising:

a fan frame having a bottom plate and a sidewall connected to the bottom plate;

a supporting base formed at the bottom plate; and a plurality of ribs extending from an outer circumferential surface of the supporting base to the sidewall, each rib being different from the other ribs such that the plurality of ribs is asymmetrical with respect to the supporting base.

2. The cooling fan of claim 1, wherein each rib being different from the other ribs by each rib having a different size such that the ribs are asymmetrical with respect to the supporting base.

3. The cooling fan of claim 1, wherein each rib being different from the other ribs by each rib having a center of gravity and the center of gravity of each rib is different such that the centers of gravity of each of the ribs are asymmetrical with respect to the supporting base.

4. The cooling fan of claim 1, wherein the sidewall comprises a plurality of sidewall portions connected end-to-end, thicknesses of the sidewall portions are different from each other such that the fan frame is also asymmetrical with respect to the supporting base.

5. The cooling fan of claim 1, wherein the fan frame further comprises an upper cover facing the bottom plate, the sidewall is connected between the bottom plate and the upper cover, the upper cover defines an air inlet, the bottom plate defines an air outlet.

6. The cooling fan of claim 5, further comprising an impeller and a central tube, wherein the impeller is received in the fan frame, the central tube extends from a center of the supporting base towards the upper cover, the impeller comprises a hub and a plurality of blades extending from an outer circumferential surface of the hub, the hub is rotatably mounted to the central tube.

7. The cooling fan of claim 6, wherein the plurality of blades extends from the hub towards the sidewall.

8. An electronic device comprising:

at least one heat generating element; and a cooling fan to dissipate heat generated by the heat generating element, the cooling fan comprising:

a fan frame having a bottom plate and a sidewall connected to the bottom plate;

a supporting base formed at the bottom plate; and a plurality of ribs extending from an outer circumferential surface of the supporting base to the sidewall, each rib being different from the other ribs such that the plurality of ribs is asymmetrical with respect to the supporting base.

9. The electronic device of claim 8, wherein each rib being different from the other ribs by each rib having a different size such that the ribs are asymmetrical with respect to the supporting base.

10. The electronic device of claim 8, wherein each rib being different from the other ribs by each rib having a center of gravity and the center of gravity of each rib is different such that the centers of gravity of each of the ribs are asymmetrical with respect to the supporting base.

11. The electronic device of claim 8, wherein the sidewall comprises a plurality of sidewall portions connected end-to-end, thicknesses of the sidewall portions are different from each other such that the fan frame is also asymmetrical with respect to the supporting base.

12. The electronic device of claim 8, wherein the fan frame further comprises an upper cover facing the bottom plate, the sidewall is connected between the bottom plate and the upper cover, the upper cover defines an air inlet, the bottom plate defines an air outlet.

13. The electronic device of claim 12, wherein the cooling fan further comprises an impeller and a central tube, the impeller is received in the fan frame, the central tube extends from a center of the supporting base towards the upper cover, the impeller comprises a hub and a plurality of blades extending from an outer circumferential surface of the hub, the hub is rotatably mounted to the central tube.

14. The electronic device of claim 13, wherein the plurality of blades extends from the hub towards the sidewall.

* * * * *